US010134936B2

United States Patent
Piccione et al.

(10) Patent No.: US 10,134,936 B2
(45) Date of Patent: Nov. 20, 2018

(54) APD FOCAL PLANE ARRAYS WITH BACKSIDE VIAS

(71) Applicant: Princeton Lightwave, Inc., Cranbury, NJ (US)

(72) Inventors: Brian Piccione, Collingswood, NJ (US); Mark Allen Itzler, Princeton, NJ (US)

(73) Assignee: ARGO AI, LLC, Pittsburgh, PA (US)

( * ) Notice: Subject to any disclaimer, the term of this patent is extended or adjusted under 35 U.S.C. 154(b) by 0 days.

(21) Appl. No.: 15/269,190

(22) Filed: Sep. 19, 2016

(65) Prior Publication Data

US 2017/0084773 A1 Mar. 23, 2017

Related U.S. Application Data

(60) Provisional application No. 62/248,190, filed on Oct. 29, 2015, provisional application No. 62/220,931, filed on Sep. 18, 2015.

(51) Int. Cl.
| | |
|---|---|
| *G01T 1/02* | (2006.01) |
| *H01L 31/107* | (2006.01) |
| *H01L 29/66* | (2006.01) |
| *H01L 27/146* | (2006.01) |
| *H01L 31/02* | (2006.01) |
| *H01L 31/0304* | (2006.01) |

(52) U.S. Cl.
CPC .... *H01L 31/1075* (2013.01); *H01L 27/14634* (2013.01); *H01L 27/14636* (2013.01); *H01L 27/14643* (2013.01); *H01L 27/14694* (2013.01); *H01L 31/02005* (2013.01); *H01L 31/0304* (2013.01)

(58) Field of Classification Search
CPC ............... H01L 31/107; H01L 31/1075; H01L 27/14643
USPC .................... 257/186, 199, 481; 250/370.07
See application file for complete search history.

(56) References Cited

U.S. PATENT DOCUMENTS

| | | | |
|---|---|---|---|
| 6,515,315 B1* | 2/2003 | Itzler ................... | H01L 31/1075 257/186 |
| 6,894,322 B2* | 5/2005 | Kwan ................. | H01L 31/0304 257/186 |
| 8,101,971 B2* | 1/2012 | Dutta ................ | H01L 27/14634 257/184 |
| 8,829,452 B1* | 9/2014 | Brown ............ | H01L 31/035218 250/370.07 |
| 9,373,732 B2* | 6/2016 | Velichko ........... | H01L 31/02327 |
| 2008/0012104 A1* | 1/2008 | Pauchard ........ | H01L 31/035281 257/676 |

(Continued)

OTHER PUBLICATIONS

Mark A. Itzler et al., "Dark Count Statistics in Geiger-Mode Avalanche Photodiode Cameras for 3-D Imaging LADAR", "IEEE Journal of Selcted Topids in Quantum Electronics", dated Nov. 1, 2014, vol. 20, No. 6, Publisher: IEEE.

(Continued)

*Primary Examiner* — David Vu
*Assistant Examiner* — Brandon Fox
(74) *Attorney, Agent, or Firm* — Kaplan Breyer Schwarz, LLP

(57) ABSTRACT

An avalanche photodiode (APD) array with reduced cross talk comprises, in the illustrative embodiment, a 2D array of Geiger-mode APDs, wherein a via is formed through the backside (substrate) of each APD in the array.

21 Claims, 8 Drawing Sheets

(56) References Cited

U.S. PATENT DOCUMENTS

| | | | |
|---|---|---|---|
| 2009/0121305 A1* | 5/2009 | Pan | H01L 31/107 |
| | | | 257/436 |
| 2016/0126381 A1* | 5/2016 | Wang | H01L 31/035227 |
| | | | 257/429 |
| 2017/0031010 A1* | 2/2017 | Suzuki | G01S 7/4865 |
| 2017/0040368 A1* | 2/2017 | Grzesik | H01L 27/14623 |
| 2017/0062496 A1 | 3/2017 | Lai et al. | |

OTHER PUBLICATIONS

Brian Piccione et al., "Spatial modeling of optical crosstalk in InGaAsP Geiger-mode APD focal plane arrays", "Optics Express", dated May 6, 2016, vol. 24, No. 10, Publisher: Optical Society of America.
Non-Final Rejection dated Jun 29, 2018 for U.S. Appl. No. 15/913,632.

* cited by examiner

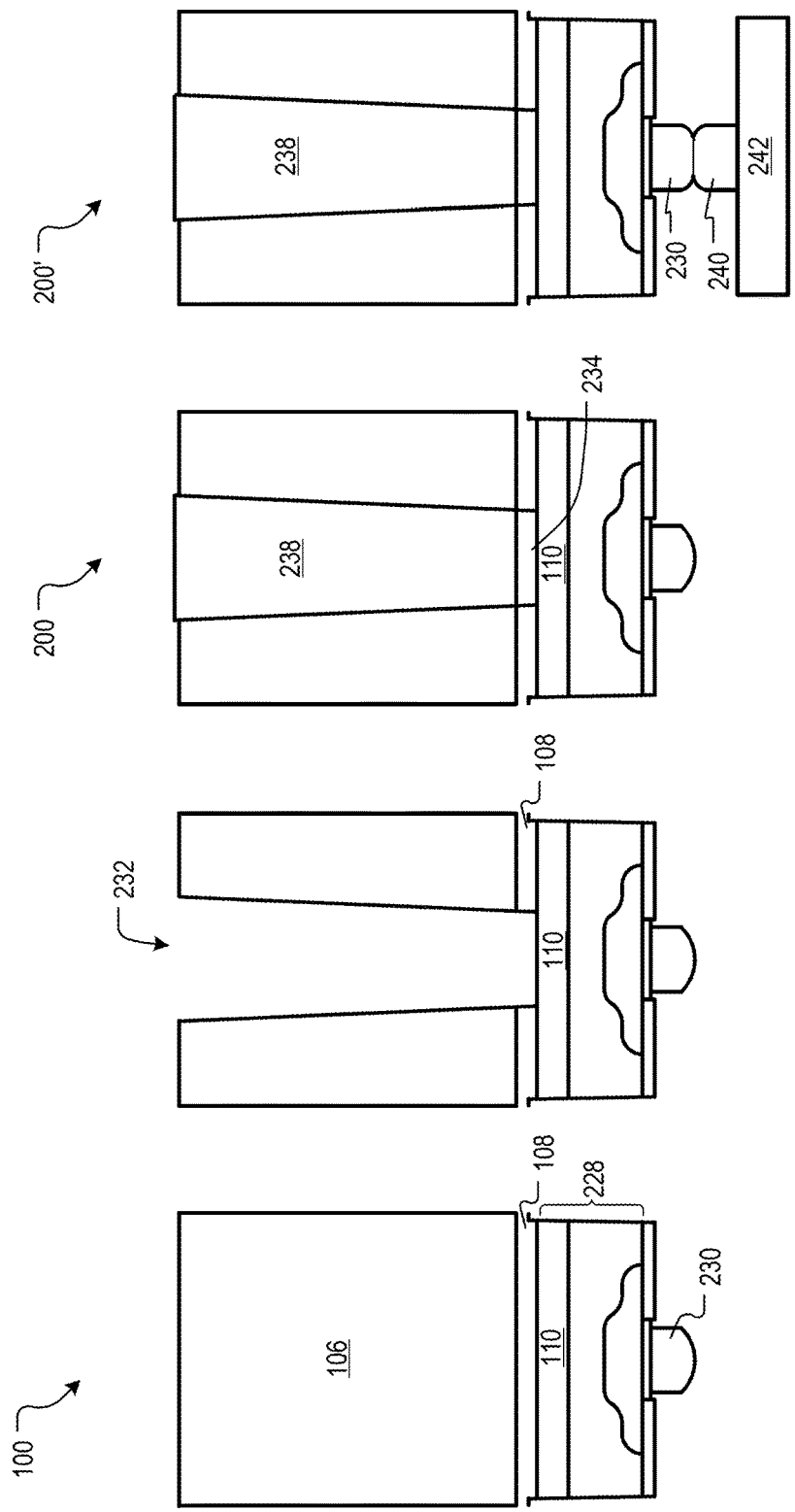

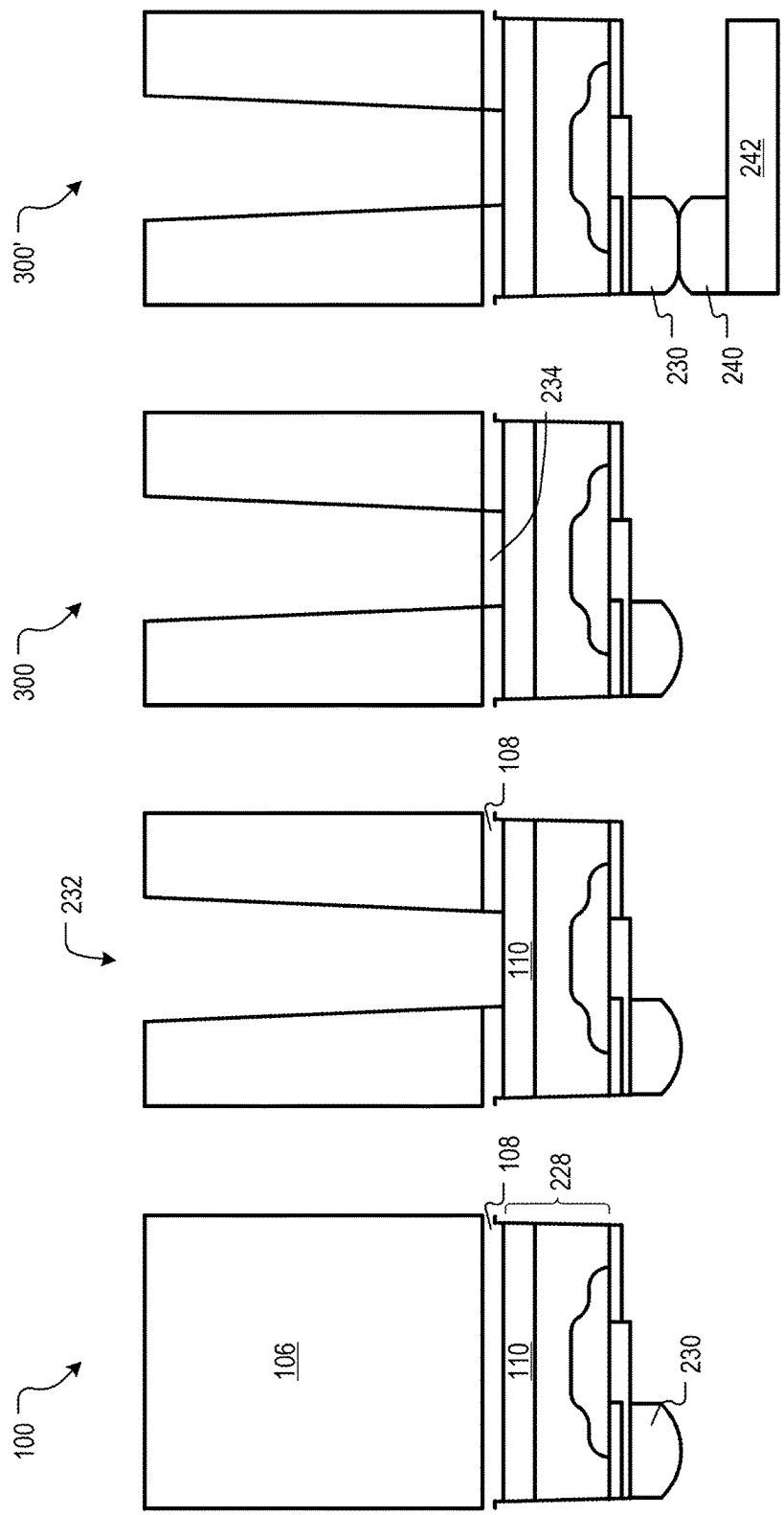

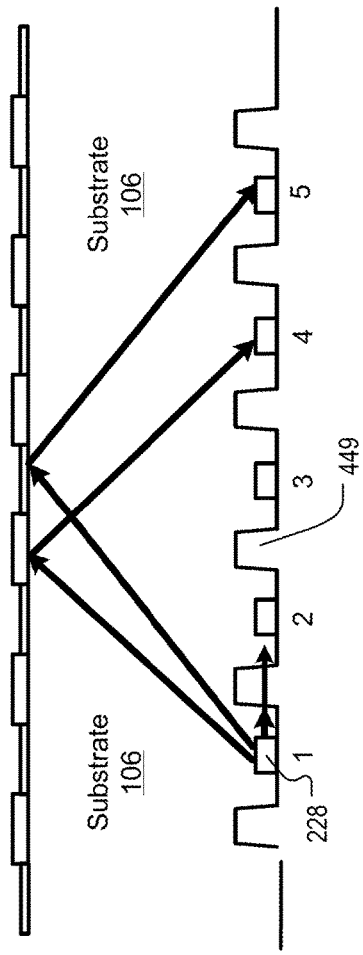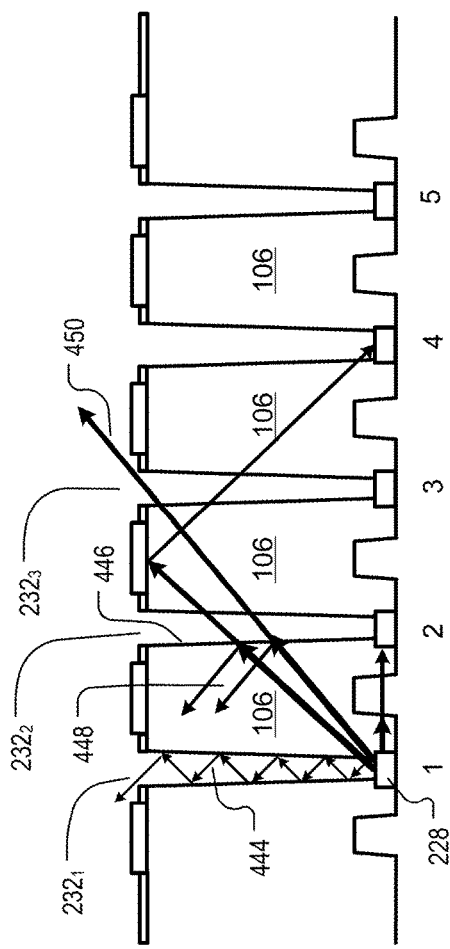

APD FOCAL PLANE ARRAYS WITH BACKSIDE VIAS

STATEMENT OF RELATED CASES

This case claims priority of U.S. Pat. Appl. Ser. No. 62/220,931 filed Sep. 18, 2015 and U.S. Pat. Appl. Ser. No. 62/248,190 filed Oct. 29, 2015, both of which cases are incorporated herein by reference.

FIELD OF THE INVENTION

The present invention relates generally to avalanche photodiodes.

BACKGROUND OF THE INVENTION

Among all defining characteristics of a solid-state image sensor technology, photo- and spectral-sensitivity are vital in determining the breadth of end-user applications. Concomitant single-photon detection with multispectral response stands as the ultimate goal within this space, but achieving both in a single, monolithic device presents a substantial challenge. To detect single photons with high fidelity—a high signal-to-noise ratio—detectors must provide large electrical gain in the optical-to-electrical conversion process and the false count events generated through on-chip electroluminescence, known as optical crosstalk, must be kept at a minimum.

In essentially all semiconductor photodetectors of visible or infrared light, each incident photon creates only a single photo-excited electron by the photoelectric effect. Spectral response is typically limited as well, with either device structure or material band gap preventing detection outside of a narrow design band. The few prior-art technologies which do provide a wide spectral response do not have single-photon sensitivity and those that exhibit single-photon sensitivity are generally confined to either visible through near-infrared (Vis-NIR) or short-wave infrared (SWIR) wavelength ranges. One technology that nearly satisfies both criteria at present, with prior-art devices demonstrating the capacity for either wide spectral response or single-photon sensitivity (but not both in the same device), is a type of semiconductor photodetector known as the avalanche photodiode (APD).

APDs provide optical-to-electrical gain by exploiting carrier multiplication through the impact ionization process. They are designed so that each photo-excited charge induced in the absorption region of the device is injected into a multiplication region where this charge is accelerated by a large electric field. When the injected charge reaches a sufficiently high kinetic energy, it can generate an electron-hole pair through an inelastic collision with lattice atoms in a process referred to as "impact ionization." These newly liberated carriers are then also accelerated, and the process continues to create an "avalanche" of charge until all carriers have exited the high-field multiplication region of the device.

At a sufficiently large electric-field intensity known as the "avalanche breakdown field," there is a finite probability that the avalanche multiplication process can lead to a self-sustaining avalanche. By applying a field larger than the breakdown field, the APD is operated in a metastable state in which the injection of a single photo-excited charge can trigger the build-up of an easily detectable macroscopic pulse of charge in an extremely short (c.a., <1 nanosecond) avalanche build-up period. This so-called "Geiger-mode" operation can provide high-efficiency detection of single photons. Devices operated in this regime are referred to as Geiger-mode APDs (GmAPDs). As those skilled in the art will appreciate, there are certain slight structural differences between a conventional APD and a GmAPD.

Although GmAPDs presently provide the highest internal gain of any solid-state detection technology, their spectral response is limited in the same manner as conventional semiconductor detectors: by device design and absorber band gap. GmAPDS built on silicon are considered a mature technology with device designs that enable wavelengths as short as 400 nanometers (nm) to reach device active areas for detection. Unfortunately, the 1.12 eV indirect band gap of silicon at room temperature limits its detection of longer wavelengths to the NIR (<1000 nm).

In order to enable detection of SWIR wavelengths (i.e., >1000 nm), GmAPDs must instead be built upon materials with smaller band gaps. But working with alternative materials comes at a significant cost in process and product maturity, as all silicon technologies benefit from its decades atop the global semiconductor marketplace. So although alternative materials must be used to obtain SWIR sensitivity, present designs, which in turn are dictated by material structure and fabrication capabilities, typically result in visible and NIR photons being absorbed before reaching the device active regions which register detection events.

GmAPDs of various materials have been used in each pixel of a focal plane array to create imagers with single photon sensitivity. One prior-art approach uses these GmAPD arrays to simply count every time a photon strikes a given pixel to build up an intensity image based on the number of counts per pixel in a given integration time. (This is essentially a digital analogue to the less sensitive analog imagers that involve the capacitive integration of photo-induced current.)

An unwelcome consequence of this extreme sensitivity to external photons is an extreme sensitivity to thermal generation of electrons and holes—so-called "dark counts"—within the depletion region. There is also an additional generator of dark counts that is unique to the focal plane array geometry; namely, electroluminescence from active regions during avalanche events, which cause spurious dark counts in neighboring pixels. In some instances, the emitted photons travel directly to their nearest neighbors, while in others, the photons will first travel towards the back side of the material substrate before reflecting back towards further distant neighboring pixels. These spurious dark counts reduce spatial and temporal image fidelity.

SUMMARY OF THE INVENTION

The present invention provides a novel APD device structure that enables single-photon sensitivity: (1) with substantially reduced crosstalk compared to the prior art and/or (2) across the visible and SWIR spectra.

In accordance with embodiments of the invention, a via is etched at least partially through the backside of an APD. In some embodiments, the via is etched fully through the substrate of an APD. In the illustrative embodiment, the via is etched fully through the substrate of a GmAPD.

2D GmAPD arrays in accordance with the present teachings (either partial or full vias) exhibit reduced total optical crosstalk relative to conventional GmAPD arrays. This is due to the fact that the vias within the substrate ("backside vias") substantially reduce backside-reflected cross talk. In particular, the generated photons encounter surfaces that promote reflection and/or absorption, thereby significantly reducing the number of such photons that reach neighboring active regions. In some embodiments, the vias are offset from the active regions of the APD; in some other embodiments, the vias are aligned with the active regions of the APD.

In the case of InGaAs/InP detectors in particular, the substrate material is InP, which absorbs over 99% of visible light within a distance of a few microns. Therefore, the use of a full via that is aligned with the active region of the device provides unimpeded access to visible-wavelength photons, thereby extending InP-based GmAPD camera sensitivity from SWIR to visible wavelengths as follows:

Prior-art GmAPD spectral response: about 900 nm to about 1100 nm (for InGaAsP absorber)
about 900 nm to about 1600 nm (for InGaAs absorber)
Spectral response of GmAPD in accordance with the illustrative embodiment:
about 400 nm to about 1100 nm (for InGaAsP absorber)
about 400 nm to about 1600 nm (for InGaAs absorber)

Some prior art GmAPDs have accomplished this functional goal (i.e., extending spectral response of the GmAPDs to the visible range) by entirely removing the InP substrate through mechanical or chemical means, typically leaving a structure having a thickness of about 10 microns that is composed entirely of the active regions. There are, however, three noteworthy problems with this approach:

1) full substrate removal has only been accomplished on individual singulated die after primary assembly steps because it is not viable on full wafers;
2) it is very difficult to scale to mass production because it is executed on singulated die; and
3) it precludes the etching of the front-side trenches necessary with GmAPDs, which can result in a substantial increase in crosstalk. See, e.g., FIG. 4B (reference numeral 449).

To create these prior-art devices, the structures are first hybridized for mechanical support, before running each individual hybridized photon-detection array (PDA)/read-out integrated circuit (ROIC) stack through the substrate removal step. Doing so is much more time-consuming and costly than process flows, such as for embodiments of the invention, that complete all PDA-level operations prior to hybridization.

BRIEF DESCRIPTION OF THE DRAWINGS

FIGS. 2A-C depict a sequence of steps for fabricating a first embodiment of an APD or GmAPD in accordance with present teachings.

FIG. 2D depicts the APD or GmAPD of FIG. 2C hybridized to a read-out integrated circuit (ROIC).

FIGS. 3A-C depict a sequence of steps for fabricating a second embodiment of an APD or GmAPD in accordance with the present teachings.

FIG. 3D depicts the APD or GmAPD of FIG. 3C hybridized to an ROIC.

FIG. 4A depicts, for an array of conventional GmAPDs, photons traveling from a primary avalanche location, as generated by blackbody radiation and electroluminescence, toward neighboring active pixels, such as via backside substrate reflection, resulting in spurious dark counts.

FIG. 4B depicts, for an array of GmAPD in accordance with the present teachings, the manner in which backside-etched vias reduce backside-reflected crosstalk.

DETAILED DESCRIPTION

Embodiments of the present invention are applicable to both linear-mode APDs and GmAPDs. The benefit, however, for reduced crosstalk is most significant in the case of GmAPDs. Although there are some structural differences between the linear-mode and Geiger-mode APDs (mostly a variation in thickness of certain layers), the primary differences pertain to their mode of operation. Additionally, the read-out integrated circuit (ROIC) that is used with a linear-mode APD requires analogue circuitry to amplify avalanche signals whereas GmAPDs can utilize a much simpler digital readout circuitry (since the signal coming out of the GmAPD is already macroscopic and readable without further amplification). It is to be understood that the structures shown in the various Figures are generic for linear-mode and Geiger-mode APDs and the present teachings apply to both. For convenience, this description will simply refer to the devices as "GmAPDs," which is intended to include both Geiger-mode and linear-mode APDs unless otherwise indicated.

Figure 1:
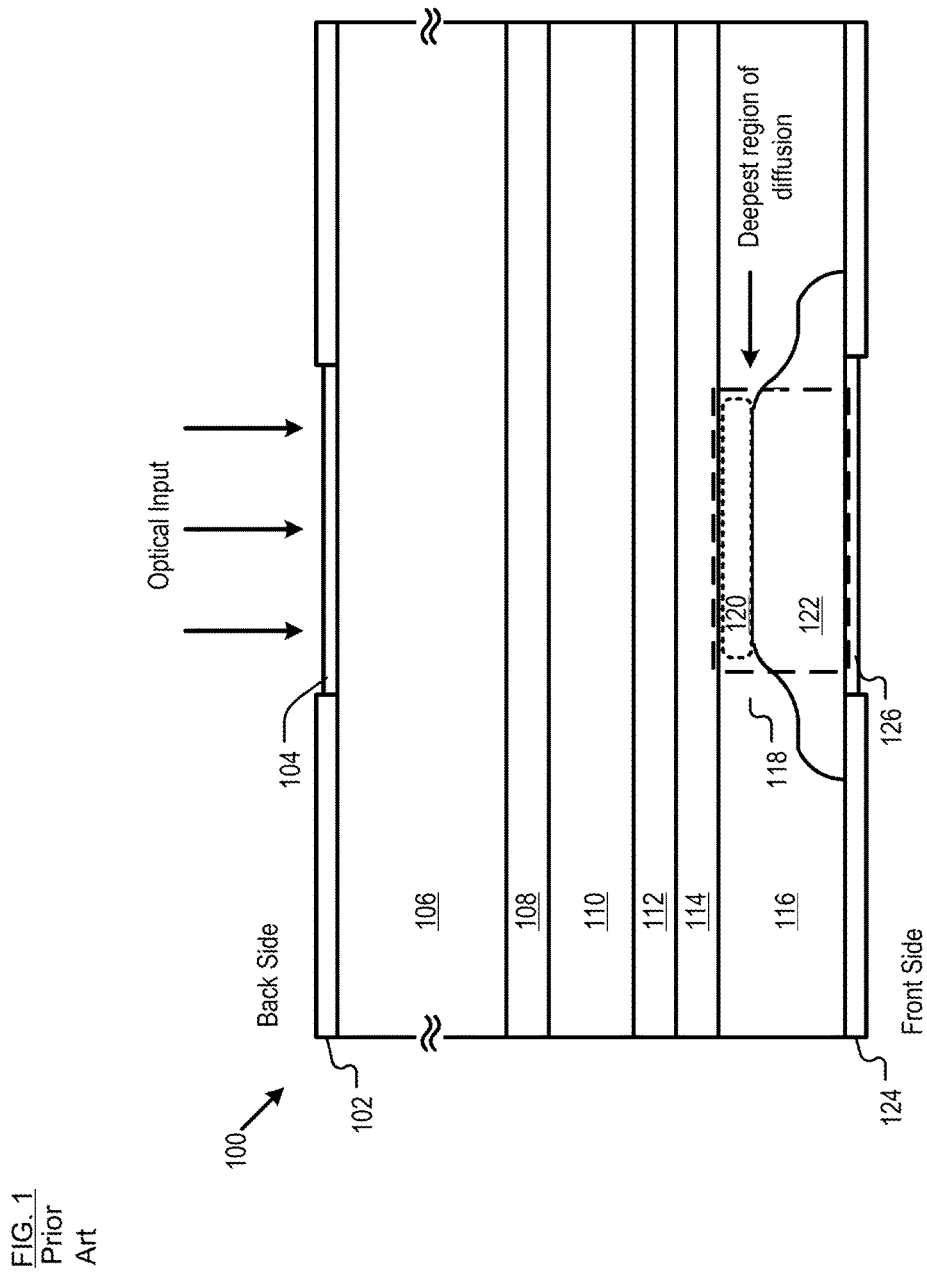
FIG. 1 depicts a representative prior-art InGaAs/InP APD or GmAPD device structure with back-side illumination.

FIG. 1 depicts a typical prior-art InGaAs/InP GmAPD 100. In FIG. 1, the GmAPD is oriented such that the "back side" (i.e., the substrate) is depicted as being the "top" of the GmAPD.

GmAPD 100 comprises n-contact metallization 102, anti-reflection coating 104, substrate 106, buffer layer 108, absorption layer 110, grading layer 112, field control layer 114, cap layer 116, passivation layer 124, and n-contact metallization 126. Cap layer 116 comprises active region 118, which comprises multiplication region 120 and a portion of diffused-region 122. As used herein and in the appended claims, the term "active region" refers to a region that encompasses multiplication region 120 and a portion of diffused region 118, wherein the extent of the included portion of the diffused region is bounded laterally by the dashed lines, wherein that lateral extent is defined or determined by the deepest region of the diffusion.

In a specific example of prior-art GmAPD 100 depicted in FIG. 1, substrate 106 is $n^-$ InP. The substrate, which typically has a thickness of about 200 microns, is truncated in FIG. 1. In some other embodiments, InP substrate 106 and InP buffer layer 108 can be $n^+$ (highly doped).

Absorption layer 110 is typically a lightly-doped intrinsic layer of indium gallium arsenide (InGaAs) or (InGaAsP) with low band-gap energy. Grading layer 112 is an n-doped indium gallium arsenide phosphide (InGaAsP) layer that smooths the interface between absorption layer 110 and field control layer 114. The field control layer is a moderately n-doped layer of indium phosphide. Field control layer 114 enables a low electric field to be maintained in absorption layer 110, while supporting a high electric field in multiplication region 120.

Cap layer 116 is an intrinsic layer of indium phosphide. Within cap layer 116 is active region 118, which includes multiplication region 120 and diffused-region 122. Active region 118 is formed by diffusing a high level of p-type dopant into the cap layer to form diffused region 122. The extent of diffused region 122 forms a p-n junction. The undoped portion of active region 118 forms multiplication region 120. Avalanche multiplication occurs substantially in multiplication region 120. In some other prior-art GmAPDs, cap layer 116 is a lightly n-doped layer of indium phosphide and diffused region 122 is heavily doped with a p-type dopant. In yet some further embodiments, cap layer 116 is a lightly p-doped layer of indium phosphide and diffused-region 122 is heavily doped with an n-type dopant.

As previously noted, most conventional SWIR GmAPD cameras are illuminated from the backside (i.e., through the substrate) as a consequence of assembly and device structure considerations. As a result, all incoming photons must first traverse hundreds of microns of substrate material before reaching the active region of the device. Almost all visible photons are absorbed by the InP substrate.

FIGS. 2a-d and 3a-d depict two embodiments of the invention. The figures show the formation of an individual GmAPD; it will be appreciated that the processing is typically performed on a 2D array of such GmAPDs. Indeed, one of the benefits of embodiments of the present invention is that they are amenable to wafer-level processing.

In both embodiments, a wafer-level approach is utilized that maintains a majority of the InP substrate intact through the use of deep-etched via structures. As previously indicated, etching vias, as opposed to removing the entire substrate, enables visible photons to reach the i-InGaAsP (1064 nm absorber) or i-InGasAs (1550 nm absorber) absorption layer while still providing sufficient mechanical support to allow for efficient wafer-level processes such as backside metallization, anti-reflection coating, and die singulation as well as singulated die operations such as hybridization. And regardless of the extended spectral response, the presence of the vias substantially reduces the total crosstalk in an array of GmAPDs.

Fabrication of the structure 200' depicted in FIG. 2d and structure 300' depicted in FIG. 3d begins with epitaxial growth on InP wafer 106, producing the same "active device layers," (see, FIG. 1, absorption layer 110, grading layer 112, charge layer 114, multiplication region 120 and diffused region 122), collected referenced as "228," as in current SWIR sensors fabricated by Princeton Lightwave Incorporated of Cranbury, N.J. For use herein and the appended claims, the phrase "active device layers" means the absorption layer, grading layer, charge layer, multiplication region and diffused region of an APD or GmAPD. See, FIGS. 2A and 3A.

In the illustrative embodiment, the substrate is InP. This is an appropriate substrate for an InGaAsP, InGasAs, or InAs absorption layer. If a different absorber is used then a different substrate may be required. For example, if a mercury cadmium telluride (MCT) absorption layer is used, then the substrate will typically be CdTe or CdZnTe. If an InAs absorption layer is used, the substrate will typically be InP or InAs.

In the structures shown in FIGS. 2A-D, indium bump 230, which is used for joining the ROIC, is centered with respect to active device layers 228. In the structures shown in FIGS. 3A-D, indium bump 230 is laterally offset with respect to active device layer 228. This provides additional mechanical stability during hybridization.

Referring now to FIGS. 2B and 3B, substrate 106 is reduced (e.g., ground, etc.) to a thickness of about 100 microns and the diameter of each via is defined with photoresist (not depicted) in known fashion. An established deep dry-etch technique, such as, without limitation, deep reactive ion etching (DRIE) is used to etch down approximately 90 microns, forming via 232. Next, an HCl-based wet etch is used to remove the remaining 10 microns of material (buffer layer 108), using absorption layer 110 as an etch stop.

Figure 6:
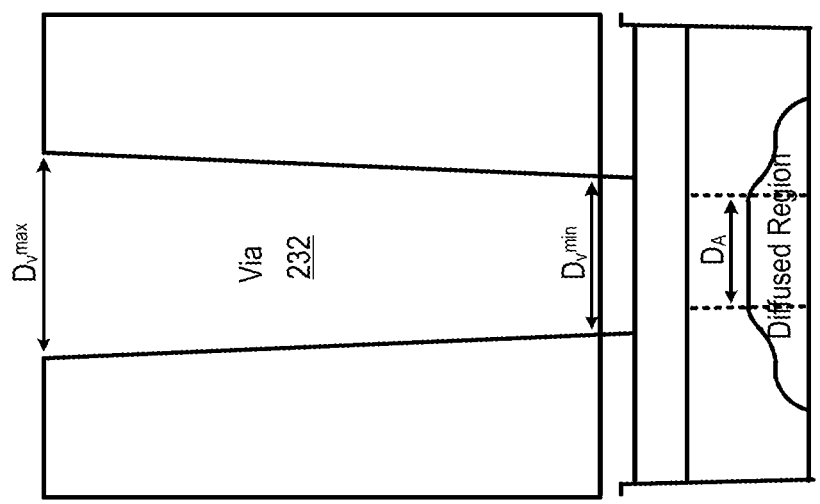
FIG. 6 depicts an APD or GmAPD having a via in accordance with the illustrative embodiment, wherein minimum and maximum via diameter is compared to the diameter of the active region of the APD or GmAPD.

Referring also to FIG. 6, in the illustrative embodiment, via 232 is centered with respect to the active region of GmAPD. Since there is a slope to the sidewalls of via 232, dependent on the etching technique, via 232 has a minimum diameter $D_v^{min}$, which is located at the bottom of the via and a maximum diameter $D_v^{max}$, which is located at the top of the via. Minimum diameter $D_v^{min}$ must be at least as large as diameter $D_A$ of the active region so that light can reach the entire extent of the active area unimpeded. The diameter $D_A$ of the active region is defined by the deepest region of the diffused region. To maintain structural integrity of the final structure (i.e., 200' or 300'), maximum diameter $D_v^{max}$ of via 232 is limited to no more than about three-quarters of the pixel pitch (i.e., the center-to-center distance between adjacent pixels). The table below shows exemplary minimum and maximum via diameter for arrays having different pitches:

| Pitch | Active Region Diameter <microns> | | Via Diameter $D_v^{min}$ <microns> | Via Diameter $D_v^{max}$ <microns> |
| --- | --- | --- | --- | --- |
| | Min | Max | | |
| 25 | 4 | | 4 | 19 |
| | | 10 | 10 | 19 |
| 50 | 8 | | 8 | 38 |
| | | 20 | 20 | 38 |
| 100 | 10 | | 10 | 75 |
| | | 34 | 34 | 75 |

With reference to FIGS. 2C and 3C, absorption layer 110 is then coated with a suitable electrical passivation layer 234 that is not opaque (but need not be fully transparent) and optionally anti-reflective. The "layer" 234 can comprise a single layer or multiple layers. In some embodiments, layer 234 comprises silicon dioxide. This results in a via-enhanced GmAPD. For via-enhanced GmAPD 200, via 232 is filled with transparent epoxy 236 forming backfilled via 238. For via-enchanced GmAPD 300, via 232 is not filled with epoxy (or any other material).

Referring now to FIGS. 2D and 3D, the via-enhanced GmAPD is then hybridized, wherein it is attached to Read Out Integrated Circuit (ROIC) 242. Hybridization is implemented by coupling indium bump 230 to metallized bonding pad 240, which is attached to ROIC 242.

The vias result in reduced crosstalk, which, through reduction of spurious dark counts, improve imaging capability in all current implementations of GmAPD cameras. In conventional GmAPDs, the photons produced via blackbody radiation and electroluminescence in the multiplication region are frequently detected as false counts by neighboring pixels, as illustrated in FIG. 4a. This figure depicts five pixels 1, 2, 3, 4, and 5, each separated by "front side" trenches 449. Each pixel comprises active device layers 228. Experimental data shows an inverse relationship with distance from the originating pixel.

At the current minimum InGaAs/InP pixel pitch of 50 microns, the magnitude of nearest-neighbor crosstalk is acceptable, but shrinking to smaller pitch arrays will increase nearest-neighbor crosstalk frequency. As a consequence, crosstalk stands as a fundamental limitation in scaling to larger camera formats via smaller pitch arrays.

In the case of etched-via arrays in accordance with the present teachings, individual pixels are effectively optically isolated from one another, as depicted in FIG. 4B. Where before there was an unimpeded path through the substrate to neighboring pixels, photons travelling towards the backside of the substrate now encounter a number of surfaces that will promote reflection or absorption, significantly reducing the number of photons which reach the active regions of neighboring pixels.

Taking pixel "1" for example, some photons produced in active region 228 can escape along path 444, reflecting off the walls of via 232$_1$. Some photons produced in active region 228 will reflect, along path 448, at the interface of the substrate and wall 446 of via 232$_2$. And some photons produced in the active region will simply pass through the substrate and out through the mouth of a via, such as along path 450 out of via 232$_3$.

The use of etched "backside" vias, in accordance with embodiments of the present invention, therefore provides a way to mitigate crosstalk, which is vital in ultimately improving both temporal and spatial image fidelity in Geiger-mode APDs.

Figure 5:
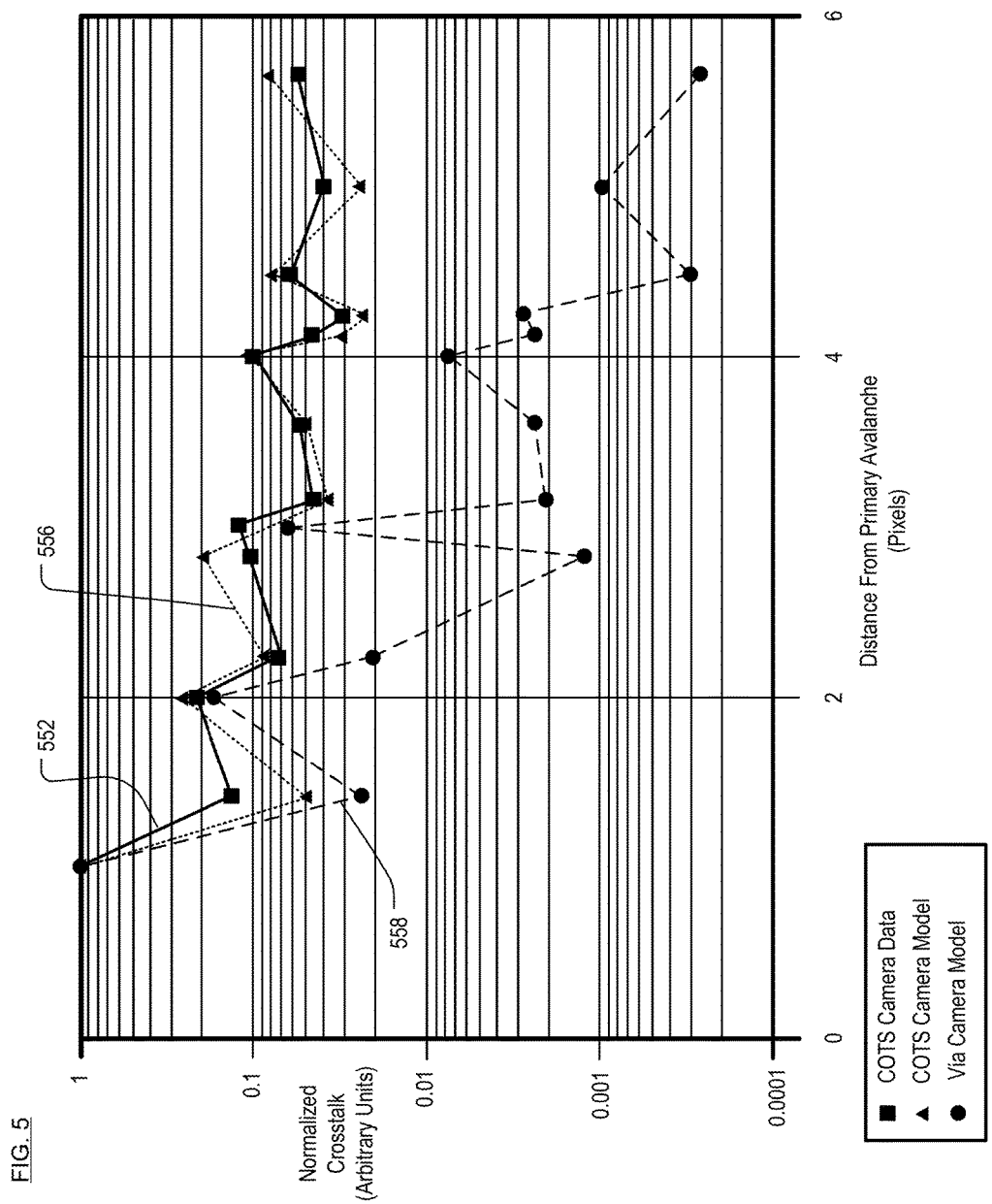
FIG. 5 depicts a comparison of the crosstalk exhibited from a conventional GmAPD camera and a GmAPD camera in accordance with the present invention.

To better quantify the impact of the vias on crosstalk, the optoelectronic response of two distinct device geometries were simulated with ray tracing. To verify the model, the geometry and epitaxial structure of a Princeton Lightwave Inc. commercial-off-the-shelf (COTS) GmAPD camera with known crosstalk performance was first recreated. The model reproduced the experimental crosstalk versus distance plot with a high degree of accuracy. This is depicted in FIG. 5. Plot 552 depicts the experimental data from an actual COTS GmAPD camera and plot 554 depicts the results of the modeling of such a camera.

This model of the COTS device was then modified to incorporate cylindrical voids, representing the vias, centered around the device active region, starting from the backside of the substrate and stopping at the absorption layer. Plot 558 depicts the results of the via-enhanced model. The benefit of the via structure is clear. That is, as distance from the primary avalanche location increases, the number of photons reaching other active regions (pixels) begins dropping by more than an order of magnitude in comparison with the COTS structure.

The computational demands of 3D modeling currently limit the simulation to a 5×5 pixel array, preventing a direct calculation of cumulative crosstalk reduction seen by a full 128×32 pixel array, which are the full dimensions of the COTS camera referenced above. However, a comparison between the COTS and via models does reveal an approximate 40% reduction for the 5×5 array, with the bulk of this reduction occurring beyond a distance of two pixels. Cumulative crosstalk has been experimentally shown to increase substantially as an N×N sampling grid is increased even to N=32, with this increase attributed largely to back-side reflections. See, e.g., Itzler et al., IEEE Journal of Selected Topics in Quantum Electronics 20 (10) 3802111, (2014); Piccione et al., Optics Express 24 (10), 10635-10648 (2016).

The use of vias, in accordance with the present teachings, substantially reduces such back-side reflections. Consequently, the gulf between the total crosstalk exhibited by a COTS camera and structures in accordance with the invention is likely to widen even further as the sample size is increased beyond 5×5.

Figure 7:
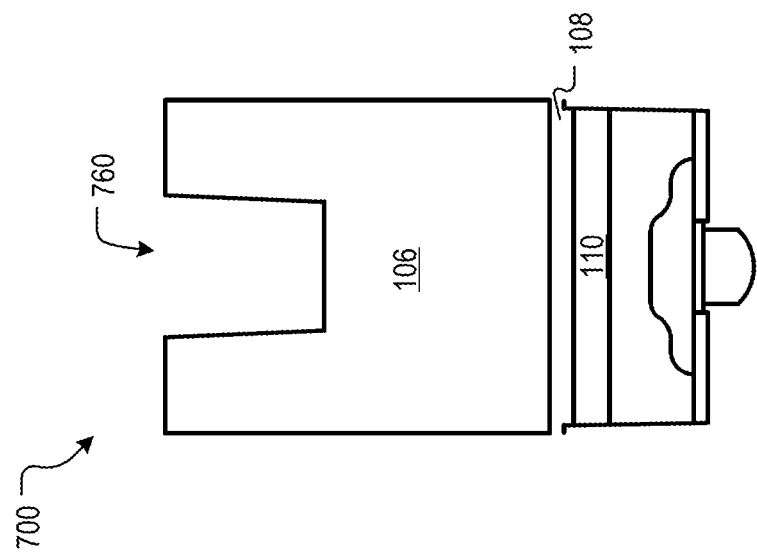
FIG. 7 depicts an APD or GmAPD with a partial via, in accordance with an embodiment of the present invention.

FIG. 7 depicts an embodiment of via-enhanced GmAPD 700 in accordance with an embodiment of the invention wherein via 760 does not extend fully through substrate 106. To the extent that the remaining substrate absorbs visible light, via-enhanced GmAPD 700 will not exhibit the enlarged spectral response possible with via-enhanced GmAPDs 200 and 300. However, as compared to a conventional GmAPD with a fully intact substrate, GmAPD 700 will exhibit reduced crosstalk. The reduction in crosstalk is a function of the depth of via 760. Those skilled in the art will be able to model the reduction in crosstalk as a function of via depth. In some embodiments, via 760 extends between 25% to 50% of the way through substrate 106. In some other embodiments, via 760 extends between 50% to 75% of the way through substrate 106. In some other embodiments, via 760 extends between 75% to 99% of the way through substrate 106.

Although GmAPD 700 depicts a centered indium bump like GmAPD 200, it is to be understood that partial via 760 can be used in conjunction with an off-center indium bump like GmAPD 300. Furthermore, partial via 760 can be back filled with a visually transparent material, such as epoxy as in GmAPD 200 (FIG. 2C) or remain unfilled like GmAPD 300.

Figure 8A:
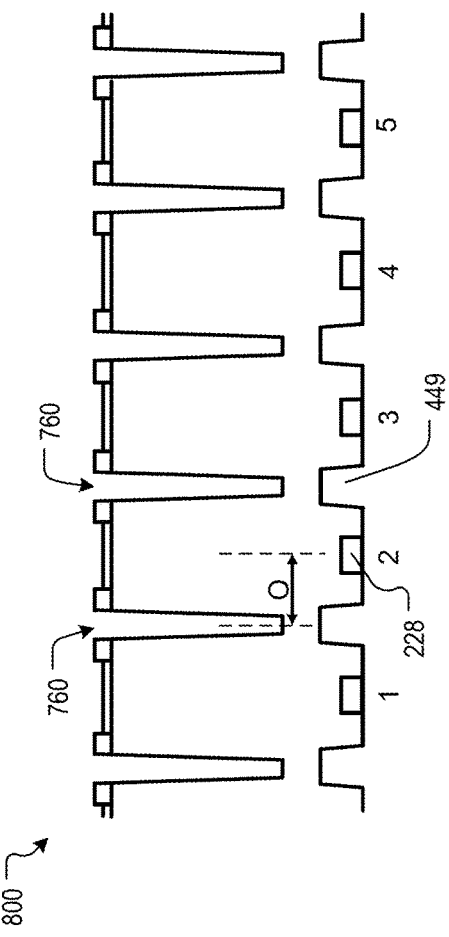
FIG. 8A depicts a side view of an array of APDs or GmAPDs in accordance with the present teachings, wherein, for each pixel, the via is offset from the active region of the pixel.
Figure 8C:
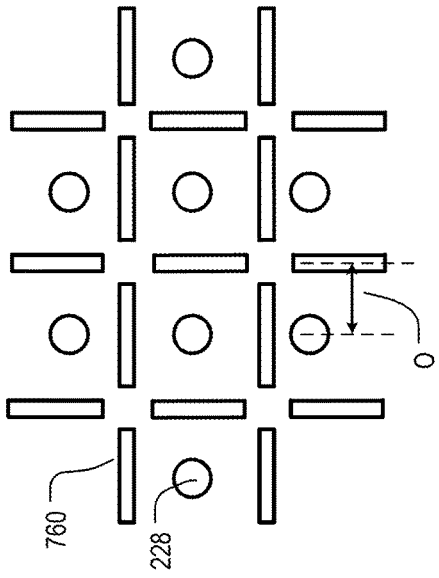
FIG. 8C depicts a plan view of a second embodiment of the array of APDs or GmAPDs depicted in FIG. 8A, wherein the vias form a discontinuous network throughout the array.
Figure 8B:
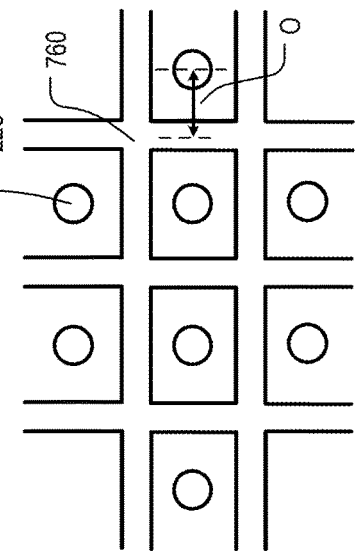
FIG. 8B depicts a plan view of a first embodiment of the array of APDs or GmAPDs depicted in FIG. 8A, wherein the vias form a continuous network throughout the array.

FIGS. 8A-8C depict some further embodiments in accordance with the present teachings. Like the embodiment depicted in FIG. 7, the vias depicted in these embodiments do not extend fully through the substrate. However, unlike the previous embodiments, the vias do not align with the active region of the APD. Rather, they are offset. Thus, these structures will not exhibit extended spectral response (i.e., the substrate will absorb visible light). They will, however, exhibit substantially reduced crosstalk.

FIG. 8A depicts a side view of a portion of array 800 of APDs or GmAPDs in accordance with the present teachings. Shown are five pixels 1, 2, 3, 4, and 5, each separated by "front side" trenches 449. Each pixel comprises active device layers 228. For each pixel, "partial" via 760 does not align with active device layers 228. In the embodiment pictured, the vias align with front-side trenches 449, each via having an offset O from the center of active device layers 228.

The vias in array 800 are not intended to deliver light, such as visible light, to the active region (not depicted) of active device layers 228. Consequently, there is no requirement that the minimum diameter of the via be at least as large as the diameter of the active region. Minimum via diameter is a function of the capabilities of the particular technique used to create the vias. The maximum diameter of the via is selected to maintain the structural integrity of the array, as discussed earlier in conjunction with other embodiments of the invention.

In the embodiment depicted in FIG. 8A, each via 760 aligns with one of front-side trenches 449. However, in some other embodiments, although offset from the active region, via 760 does not align with a front-side trench. The offset, partial vias 760 can be backfilled, such as with transparent epoxy, or can remain unfilled.

FIGS. 8B and 8C depict plan views of two embodiments 800' and 800" of array 800 of FIG. 8A. In the embodiment depicted in FIG. 8B, offset, partial vias 760 form a continuous network throughout the substrate, whereas in the embodiment depicted in FIG. 8C, offset, partial vias 760 are discontinuous. In comparison to array 800" of FIG. 8C, array 800' exhibits poorer structural integrity but somewhat lower crosstalk. This is because the discontinuous arrangement of the vias in array 800" leaves somewhat more substrate intact.

It is to be understood that the disclosure teaches just one example of the illustrative embodiment and that many variations of the invention can easily be devised by those skilled in the art after reading this disclosure and that the scope of the present invention is to be determined by the following claims.

What is claimed:

1. An article comprising a plurality of avalanche photodiodes (APDs), each APD comprising:
   a substrate layer having a first surface and a second surface, wherein, in operation, input light is received at the first surface of the substrate layer and propagates toward the second surface thereof;
   a buffer layer abutting the second surface of the substrate layer;
   a via extending from the first surface of the substrate layer and passing at least partially through the substrate layer towards the second surface thereof; and
   active device layers, wherein, at least some of the vias of the article are filled with transparent epoxy.

2. The article of claim 1 wherein the substrate layer comprises InP.

3. The article of claim 1 wherein a minimum diameter of each via is at least as large as an active region of the APDs, and wherein each via is superposed with respect to the active region of a respective APD and aligned therewith.

4. The article of claim 1 further comprising a read-out integrated circuit, wherein the read-out integrated circuit (ROIC) and the APDs are electrically coupled.

5. The article of claim 4 further comprising a plurality of indium bumps, wherein each indium bump is used to couple an APD to the ROIC.

6. The article of claim 4 wherein each indium bump aligns with a respective via.

7. The article of claim 1 wherein the APDs are Geiger-mode APDs.

8. The article of claim 1 wherein at least some of the vias pass completely through the substrate layer.

9. The article of claim 7 wherein at least some of the vias pass completely through the substrate layer.

10. An article comprising a plurality of avalanche photodiodes (APDs), each APD comprising:
    a substrate layer having a first surface and a second surface, wherein, in operation, input light is received at the first surface of the substrate layer and propagates toward the second surface thereof;
    a buffer layer abutting the second surface of the substrate layer;
    a via extending from the first surface of the substrate layer and passing at least partially through the substrate layer towards the second surface thereof; and
    active device layers, wherein:
    the APDs are organized in a 2D array, each APD defining a pixel and wherein the 2D array is characterized by a pixel pitch, and wherein a maximum diameter of the vias is about 75% of the pixel pitch and wherein a minimum diameter of the vias is at least as large as a diameter of an active region of each pixel.

11. The article of claim 10 wherein the APDs are Geiger-mode APDs.

12. The article of claim 11 wherein at least some of the vias pass completely through the substrate layer.

13. The article of claim 10 wherein a minimum diameter of each via is at least as large as an active region of the APDs, and wherein each via is superposed with respect to the active region of a respective APD and aligned therewith.

14. The article of claim 10 further comprising a plurality of indium bumps, wherein each indium bump aligns with a respective via and is used to couple a respective APD to a read-out integrated circuit (ROIC).

15. An article comprising a plurality of Geiger-mode avalanche photodiode (GmAPDs), each GmAPD comprising:
    a substrate layer having a first surface and a second surface, wherein, in operation, input light is received at the first surface of the substrate layer and propagates toward the second surface thereof;
    a buffer layer abutting the second surface of the substrate layer;
    a via passing through the substrate layer and the buffer layer; and
    an active region,
    wherein the GmAPDs are organized in a 2D array, each GmAPD defining a pixel and wherein the 2D array is characterized by a pixel pitch, and wherein a maximum diameter of the via of each of the GmAPDs in the 2D array is about 75% of the pixel pitch and wherein a minimum diameter of the via of each of the GmAPDs is at least as large as a diameter of the active region of each pixel.

16. The article of claim 15 wherein at least some of the vias are filled with a transparent material.

17. The article of claim 15 wherein the substrate layer comprises InP.

18. The article of claim 15 further comprising a read-out integrated circuit, wherein the read-out integrated circuit (ROIC) and the GmAPDs are electrically coupled to one another.

19. The article of claim 15 wherein each GmAPDs further comprises an absorption layer having a first surface abutting the buffer layer.

20. The article of claim 19 further comprising an electrical passivation layer, which is not opaque and is disposed in the via and extending between the second surface of the substrate layer and the first surface of the absorption layer.

21. The article of claim 15 further comprising a cap layer comprising a multiplication region and a diffused region, wherein the active region of the each GmAPD contains the multiplication region and a portion of the diffused region, and wherein a central axis of the via aligns with the center of the active region.

* * * * *